(12) United States Patent  (10) Patent No.: US 7,447,980 B2
Xu et al.  (45) Date of Patent: Nov. 4, 2008

(54) ERROR DETECTION AND CORRECTION IN DATA TRANSMISSION PACKETS

(75) Inventors: Bin Xu, Cupertino, CA (US); Nabil Yousef, Foothill Ranch, CA (US)

(73) Assignee: Newport Media, Inc., Lake Forest, CA (US)

( * ) Notice: Subject to any disclaimer, the term of this patent is extended or adjusted under 35 U.S.C. 154(b) by 256 days.

(21) Appl. No.: 11/251,721

(22) Filed: Oct. 17, 2005

(65) Prior Publication Data

US 2007/0089038 A1  Apr. 19, 2007

(51) Int. Cl.
*H03M 13/00* (2006.01)
(52) U.S. Cl. .................. 714/776; 714/784; 714/756
(58) Field of Classification Search .......... 714/776, 714/769, 784, 718, 756, 758, 764, 770, 799
See application file for complete search history.

(56) References Cited

U.S. PATENT DOCUMENTS 5,956,102 A * 9/1999 Lane ..................... 348/425.4
6,044,485 A * 3/2000 Dent et al. ................ 714/774

* cited by examiner

*Primary Examiner*—Jacques Louis-Jacques
*Assistant Examiner*—Fritz Alphonse
(74) *Attorney, Agent, or Firm*—Mohammad S. Rahman, Esq.; Gibb & Rahman, LLC

(57) ABSTRACT

A system and method of using recursive cyclic redundancy check (CRC)+forward error correction (FEC) for enhancing the channel coding gain for a DVB-H receiver, and using a physical (PHY) Reed-Solomon (RS) decoder+FEC to achieve better coding gain. The system and method utilize a dual mode RS decoder (erasure mode and error mode) for FEC decoding. The PHY RS is used to provide smaller granularity for FEC. The system includes a cache memory management scheme for implementing the recursive CRC/RS+FEC in very large scale integrated circuit chip (VLSI) hardware.

30 Claims, 12 Drawing Sheets

After Burst

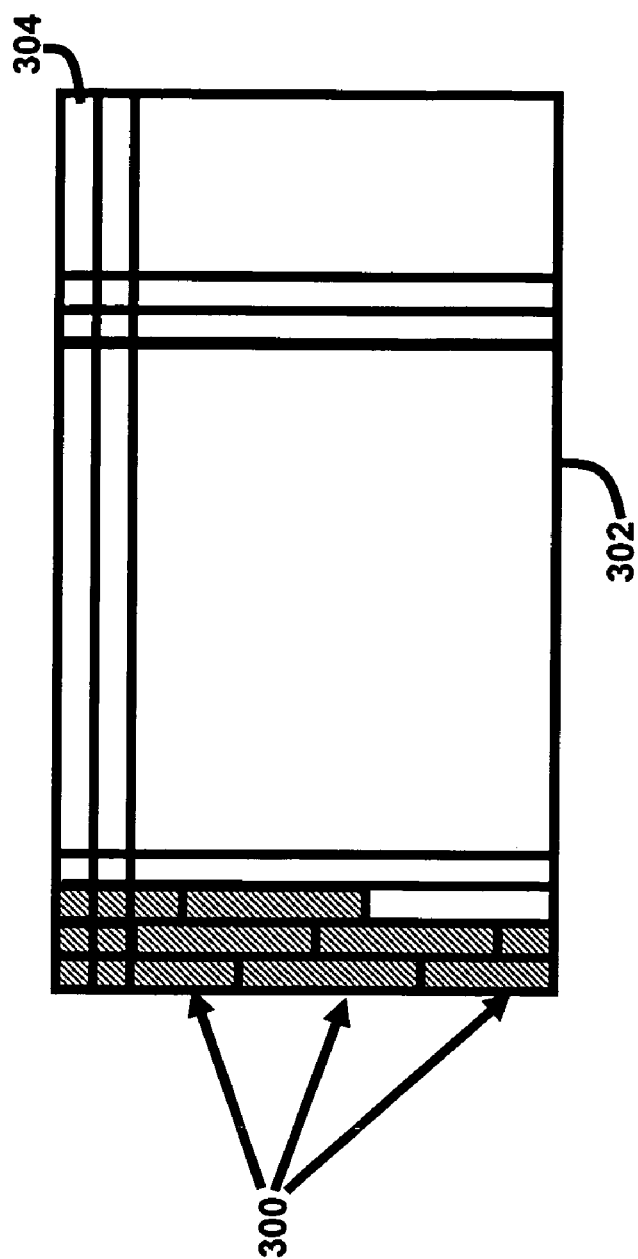

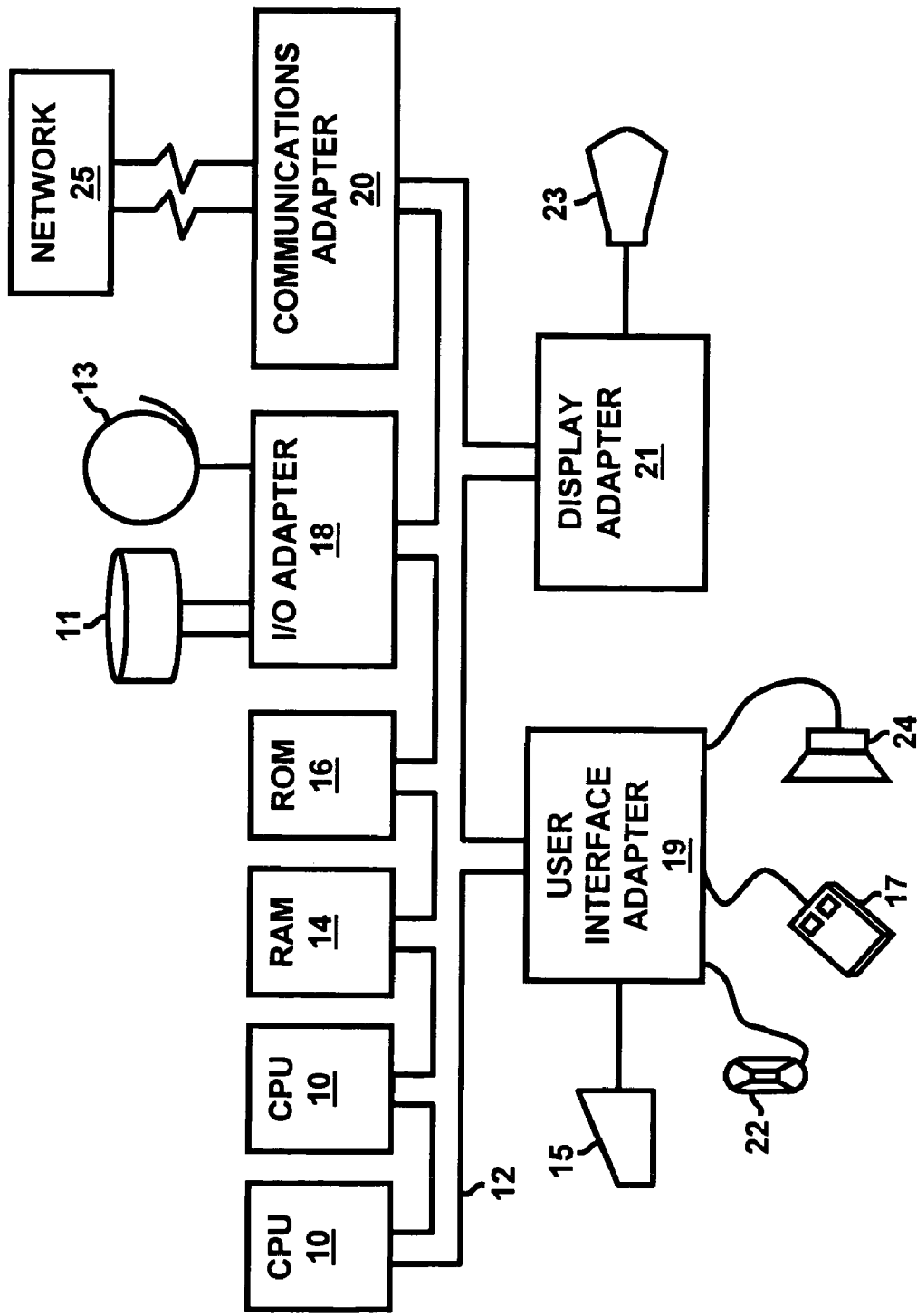

ERROR DETECTION AND CORRECTION IN DATA TRANSMISSION PACKETS

BACKGROUND

1. Field of the Invention

The embodiments herein generally relate to error detection and correction for digital data storage or transmission, and, more particularly, to techniques that generate error checking codes and decode data containing such codes.

2. Description of the Related Art

Handheld devices with integrated digital television access are a relatively new phenomenon. Such technology has traditionally been limited by size, power consumption, and most importantly performance. Poor performance of such devices has typically been the result of the constantly changing receiver environment. More particularly, the quality of the received signal is affected by the device's ability to manage adjacent-channel rejection, low signal-to-noise ratios, and Doppler compensation, among other factors.

DVB-H is the specification for bringing broadcast services to handheld receivers, and was formally adopted as an ETSI (European Telecommunications Standards Institute) standard in November 2004. More specifically, DVB-H is a terrestrial digital TV standard that tends to consume less power than its predecessor, the DVB-T standard, and generally allows the receiver to move freely while receiving the signal transmission, thereby making it ideal for cellular phones and other mobile devices to receive digital TV broadcasting over the digiTV network, and hence without having to use cellular telephone networks.

Error checking codes have been developed to assure digital data integrity in situations such as transmission of data over a communications channel or data storage onto and retrieval from a storage medium. The codes allow the existence of errors in the data stream to be identified and corrected. Two such error correction codes are the Reed-Solomon (RS) and cyclic redundancy check (CRC) codes. These codes are often used together, with RS codes being used for every block of 255 bytes of an encoded word, and CRC codes being used for checking the cluster of bytes grouped as datagrams.

The DVB-H standard generally has identified the use of time-slicing to reduce the power consumption of the device and multiprotocol encapsulation forward error correction (MPE-FEC) in order to provide an additional layer of error correction in an effort to provide a more robust signal in mobile environments. In the DVB-H standard, there is an extra channel error control coding in the link layer: MPE-FEC. The FEC is a (255, 191) RS decoder. Here, the length of the codeword is 255 bytes, which contains 191 bytes of data.

FIG. 1 illustrates the conventional manner of performing the FEC. The incoming datagram (having bytes ranging from 64 to approximately 4096 bytes, and most typically approximately 1000 bytes) in a burst from the physical layer (PHY) of the receiver is stored column by column from left to right in a 2 Mbit datagram random access memory (RAM) unit 100. At the end of each datagram there are four CRC bytes which can be used to check/flag if any bytes in that datagram are wrong. If there are one or more error bytes in that datagram, the CRC check will fail and all the bytes in that datagram will be marked as erasures. Once the entire memory unit 100 is filled, including the 191 columns on the left for data bytes and 64 columns on the right for parity bytes, the (255, 191) RS decoder will use the erasure information obtained above to decode/correct the entire 2 Mbit datagram memory 100 in a row-by-row manner.

According to the DVB-H standard, the FEC RS decoder is erasure based, and relies on the erasure information to correct up to 64 errata bytes. If the total number of erasures in a row is greater than 64, the FEC RS decoder generally cannot correct anything for this row and thus leaves it untouched by giving a decoder failure signal. Accordingly, a mobile TV receiver might discard the entire burst (2 Mbit datagram memory unit 100) if such decoding failures happen, which leads to unsmooth video or glitches during viewing of a TV broadcast. As such, there remains a need to correct this deficiency by providing a technique which enhances the performance of digital signal reception in mobile devices by providing for a better error detection/correction scheme.

SUMMARY

In view of the foregoing, an embodiment herein provides a computer-implemented method of performing error detection in data transmission packets, and a program storage device readable by computer, tangibly embodying a program of instructions executable by the computer to perform the method of performing error detection in data transmission packets, wherein the method comprises writing data into a plurality of datagrams in a storage memory medium; performing a first cyclic redundancy check (CRC) on the written data; performing a first forward error correction (FEC) Reed-Solomon (RS) decoding process row-by-row on the datagrams; marking erasures in the datagram corresponding to written data comprising errors; performing a second CRC on the written data; removing the erasures from the datagrams; and performing a second FEC RS decoding process row-by-row on the datagrams. The method may further comprises performing an additional CRC on the written data; removing all the erasures from the datagrams; and performing an additional FEC RS decoding process row-by-row on the datagrams. In one embodiment, in the removing of the erasures from the datagrams, a total number of the erasures in a particular row of the datagram exceeding 64 errata bytes is reduced to less than 64 errata bytes. In another embodiment, a physical (PHY) RS decode fail signal is used for the marking of the erasures in the datagram. The method may further comprise using an erasure mode of the FEC RS decoding process to correct the errata bytes, wherein the erasure mode is implemented using a Berlekamp-Massey algorithm.

Another embodiment provides a computer-implemented method of performing error detection in data transmission packets, and a program storage device readable by computer, tangibly embodying a program of instructions executable by the computer to perform the method of performing error detection in data transmission packets, wherein the method comprises writing data into a plurality of datagrams in a storage memory medium; marking all errata bytes in the datagrams as erasures using a first PHY RS decode fail signal on the written data; performing a first FEC RS decoding process row-by-row on the datagrams; marking all errata bytes in the datagrams as erasures using a second PHY RS decode fail signal on the written data; and removing the errata bytes from the datagrams. In one embodiment, in the removing of the errata bytes from the datagrams, a total number of the erasures in a particular row of the datagram exceeding 64 errata bytes is reduced to less than 64 errata bytes. In another embodiment, the method may further comprise marking all errata bytes in the datagrams as erasures using a third PHY RS decode fail signal on the written data. Additionally, the method may further comprise using an erasure mode of the FEC RS decoding process to correct the errata bytes, wherein the erasure mode is implemented using a Berlekamp-Massey algorithm.

Yet another embodiment provides a device capable for detecting errors in a data transmission packet, wherein the device comprises a storage memory medium; a buffer operable for writing data into a plurality of datagrams in the storage memory medium; a first register operable performing a first CRC on the written data; a decoder operable for performing a first FEC RS decoding process row-by-row on the datagrams; errata bytes corresponding to erasures in the datagram corresponding to written data comprising errors; and a second register operable for performing a second CRC on the written data; and a third register operable for removing the erasures from the datagrams, wherein the decoder is operable for performing a second FEC RS decoding process row-by-row on the datagrams. The device may further comprise a fourth register operable for performing an additional CRC on the written data and removing all the erasures from the datagrams; wherein the decoder is operable for performing an additional FEC RS decoding process row-by-row on the datagrams. In one embodiment, a total number of the erasures in a particular row of the datagram exceeding 64 errata bytes is reduced to less than 64 errata bytes in the second register. In another embodiment, a PHY RS decode fail signal is used for marking of the erasures in the datagram. Additionally, in another embodiment, the FEC RS decoding process comprises an erasure mode operable to correct the errata bytes, wherein the erasure mode is implemented using a Berlekamp-Massey algorithm.

Still another embodiment provides a device capable for detecting errors in a data transmission packet, wherein the device comprises a storage memory medium; a buffer operable for writing data into a plurality of datagrams in a storage memory medium; a first PHY RS decode fail signal device operable for marking all errata bytes in the datagrams as erasures on the written data; a decoder operable for performing a first FEC RS decoding process row-by-row on the datagrams; a second PHY RS decode fail signal device operable for marking all errata bytes in the datagrams as erasures on the written data; and a register operable for removing the errata bytes from the datagrams. In one embodiment, a total number of the erasures in a particular row of the datagram exceeding 64 errata bytes is reduced to less than 64 errata bytes in the register. The device may further comprise a third PHY RS decode fail signal device operable for marking all errata bytes in the datagrams as erasures on the written data. In another embodiment, the decoder comprises an error mode of the FEC RS decoding process operable to correct the errata bytes, wherein the error mode is implemented using a Berlekamp-Massey algorithm.

Another embodiment provides an error-detection device comprising a frame buffer memory device comprising datagrams organized into rows and columns comprising entries into which data may be entered; an erasure cache register operatively connected to the frame buffer memory device; an erasure flag register operatively connected to the erasure cache register, wherein the erasure flag register comprises an erasure bit for each byte in a first row of each column; and a decoder operable for performing a FEC RS decoding process on the datagrams in the frame buffer memory device, wherein each byte in the frame buffer memory device is marked with an erasure flag equaling any of 0 and 1 when entering the decoder. Preferably, the erasure cache register comprises a datagram tail byte address and a CRC check bit. Moreover, the decoder is preferably operable for decoding the datagrams row-by-row, wherein a row index moves down accordingly and is checked against the row index stored in the entries of each column.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 3(a) is a schematic diagram illustrating a recursive PHY+FEC decoding process according to an embodiment herein;

FIG. 9 is a computer hardware diagram according to an embodiment herein.

DETAILED DESCRIPTION OF PREFERRED EMBODIMENTS

Figure 1:
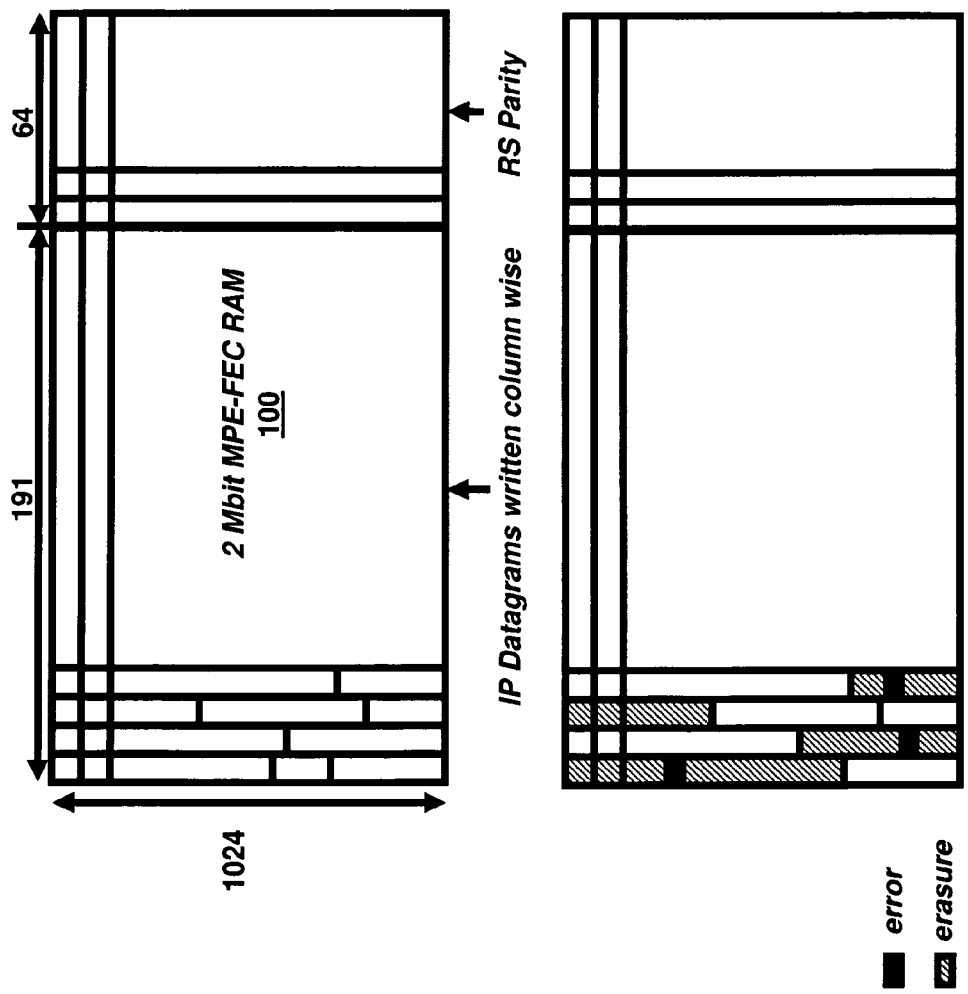
FIG. 1 illustrates a schematic diagram of a conventional manner of performing a FEC process.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a technique which enhances the performance of digital signal reception in mobile devices by providing for a better error detection/correction scheme. The embodiments of the invention achieve this by providing a dual mode FEC RS decoder and a novel approach to enhance the MPE-FEC error correction capability by using recursive CRC/Reed-Solomon and FEC decoding. Referring now to the drawings, and more particularly to FIGS. 2 through 9, where similar reference characters denote corresponding features consistently throughout the figures, there are shown preferred embodiments of the invention.

Figure 2:
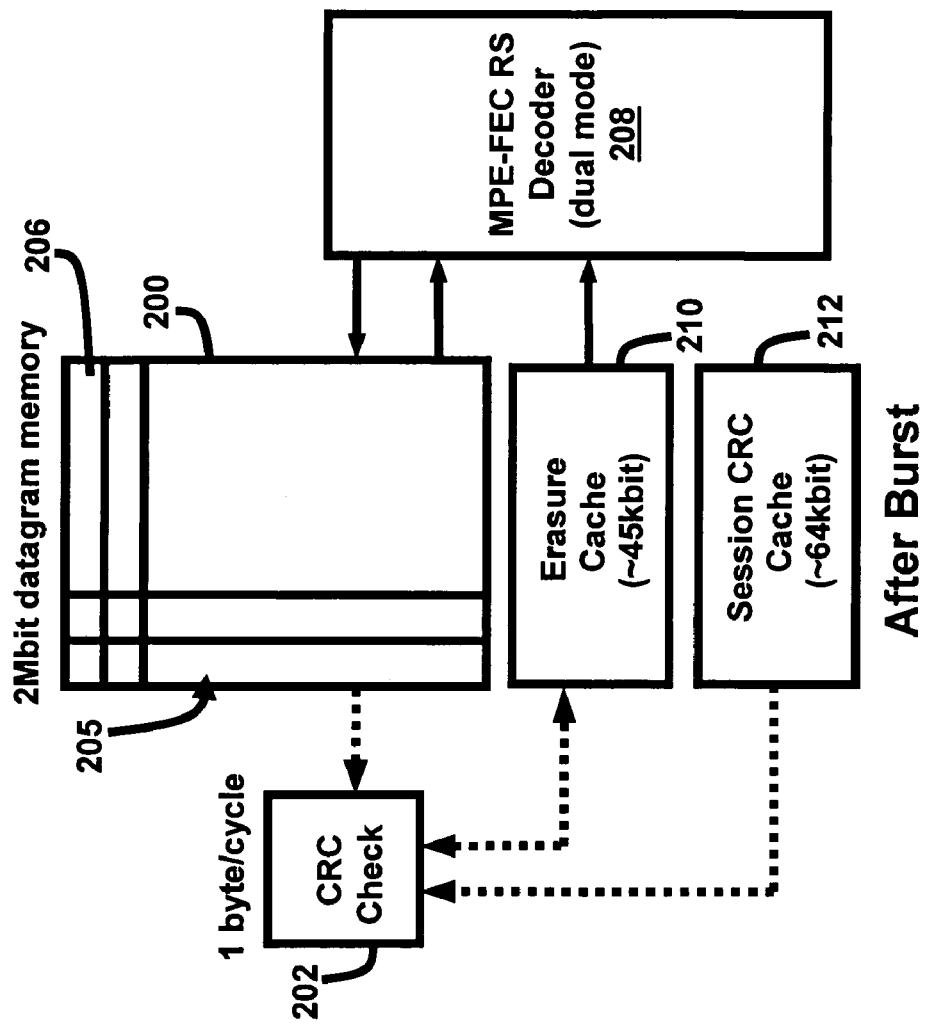
FIG. 2 is a schematic diagram illustrating a recursive CRC+FEC decoding process according to an embodiment herein.

A first embodiment is shown in FIG. 2, which illustrates a recursive CRC+FEC process. Here, after initial FEC RS decoding of the 2 Mbit datagram memory 200 occurs, a CRC check 202 is performed again for all the datagrams 205 in the memory unit 200. Because some of the errata bytes get corrected during the first-round FEC RS decoding, and normally a CRC failure of a datagram 205 is only caused by several bad bytes, the entire datagram 205 which were previously marked as erasures can now all be removed as erasures. As a result, the total number of erasures in a row 206 which exceeds 64 in the initial FEC RS decoding now has the chance to be smaller than 64, and in such cases the FEC RS decoder 208 can correct all errata using the erasure mode cache 210. As long as the total erasure count in a row 206 is smaller or equal to 64, the erasure-based FEC RS decoder 208 is able to correct all the errata bytes in that row. Further iterations between the CRC check 202 and FEC RS decoding 208 helps to clean all the errata in the 2 Mbit datagram memory 200. Here, a couple of byte corrections in one FEC decoding operation will remove erasure marks for all of the bytes (usually approximately 1,000 bytes) belonging to that datagram 212. The CRC+FEC iterations helps to eliminate the uncorrectable rows that have erasures greater than 64, hence it improves the error correction capability and coding gain as compared to the conventional processes. Moreover, one loop of CRC+FEC takes approximately 3.4 ms+6.8 ms, which equals approximately 10 ms.

Figure 3B:
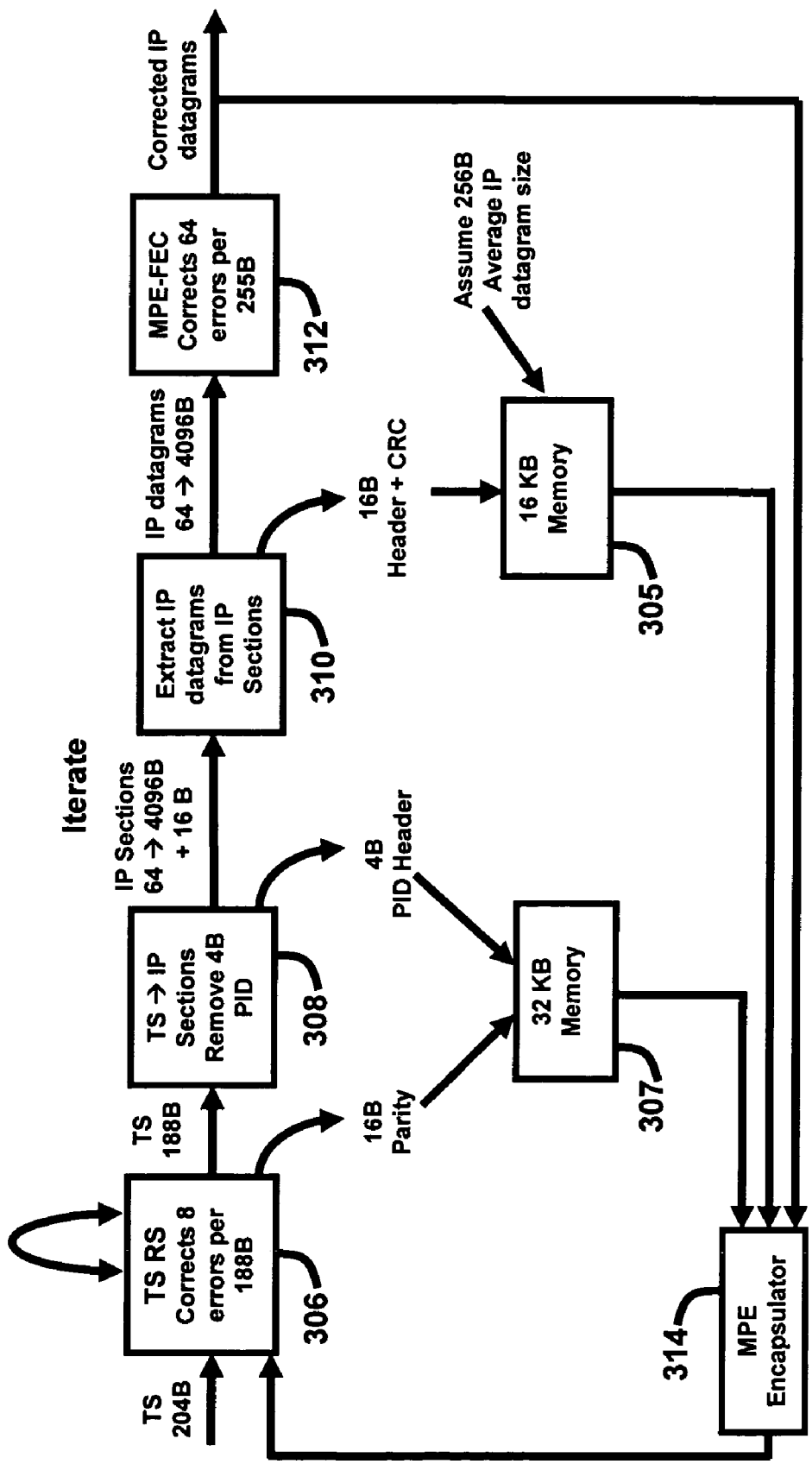
FIG. 3(b) is a schematic diagram illustrating an implementation of a recursive PHY RS+FEC decoding process according to an embodiment herein.
Figure 4:
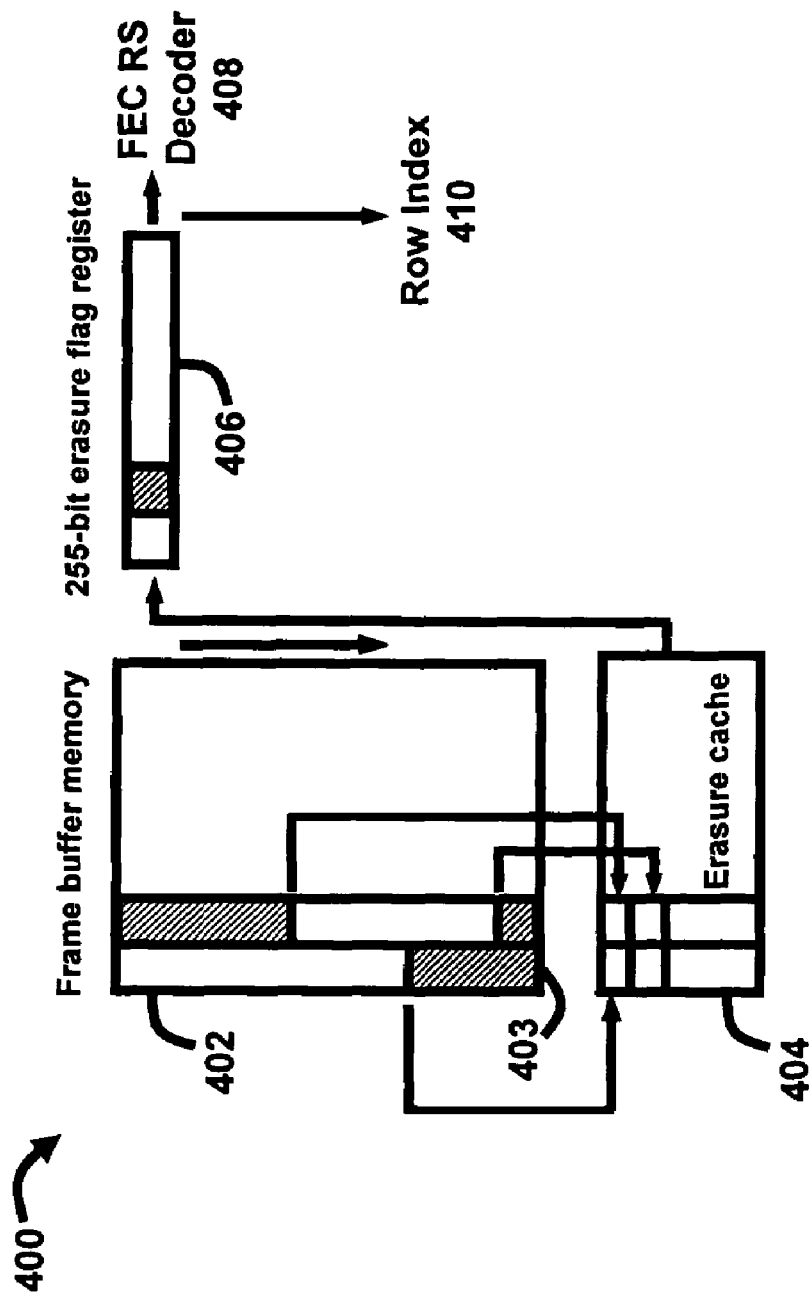
FIG. 4 illustrates a schematic diagram of an erasure cache scheme according to an embodiment herein.

In a second embodiment, recursive PHY RS+FEC, besides the recursive CRC+FEC method, the recursive PHY RS+FEC decoding approach may offer improved coding gain. This approach is illustrated in FIGS. 3(a) and 3(b). Here, the datagram bytes incoming from receiver PHY (not shown) are RS encoded using (204, 188) code. If the total number of errata bytes in a 204 byte group is smaller than 8, the PHY RS will correct all of them; otherwise, the PHY RS will flag a decode fail signal. This occurs because a standard Berlekamp-Massey algorithm indicates if the actual error bytes in the 204 bytes exceed 8. These error bytes are not correctable and thus give a decode fail signal. According to the second embodiment, a PHY RS decode fail signal is used to mark all of the 188 bytes as erasures instead of using the CRC check for the entire datagram 302. Then, the initial FEC RS decoding is performed on a row-by-row basis. The FEC RS decoding in either the erasure mode or error mode will correct some of the bytes in the datagrams 300 in the memory unit 302. Then, a second PHY RS decoding process is performed. Because some errata bytes get corrected in the initial FEC RS decoding, the 204 bytes groups which before fail the PHY RS decoding due to an errata greater than 8 now have a chance to have a total number of errata fewer than or equal to 8. In such cases, one more run of the PHY RS can correct all the errata bytes per a 204 byte group. As a result of this, the entire 188 data bytes marked as erasures before now are removed as erasures.

The second round FEC RS has fewer rows 304 with erasures greater than 64, and these rows 304 with erasures less than 64 are corrected by the FEC RS. These recursive PHY RS+FEC RS decoding processes, or turbo decoding, provide higher coding gain as compared to the recursive CRC+FEC decoding at the cost of more complex hardware implementation. More particularly, extra memory devices 305, 307 are used (16 KB and 32 KB shown in FIG. 3(b)) to store the header bytes and CRC bytes from the TP packets which are not stored in the 2 Mbit buffer memory 302 (of FIG. 3(a)).

Because the 2 Mbit memory 302 only stores the datagram bytes, the extra 32 KB memory 305 and 16 KB memory 307 are used to store the packets header bytes and CRC bytes for each datagram session. These header bytes and CRC bytes are used in the PHY RS decoding following the FEC RS decoding. As FIG. 3(b) shows, after the first PHY RS decoding process 306, the header bytes and CRC bytes are removed 308 from each datagram session and only datagram bytes are stored 310 in the 2 Mbit memory 302 (of FIG. 3(a)) for subsequent FEC RS decoding 312. After FEC RS decoding, the second PHY RS decoding process begins, and the header bytes and CRC bytes are used at this time, which are drawn from the 32 KB and 16 KB memories 305, 307 respectively of FIG. 3(b). Data is then routed to an MPE (multiprotocol encapsulation) encapsulator 314. The MPE encapsulator 314 combines the PID header bytes and CRC bytes stored in the 32 KB and 16 KB memories 305, 307 together with the datagram bytes stored in the 2 Mbit buffer 302 (of FIG. 3(a)) in order to form the original incoming transport streams (TS). Then, the recursive or iteration processes can continue.

According to a third embodiment, a PHY RS decode fail is used to mark erasures for FEC RS decoding. Here, with or without using the recursive CRC/RS+FEC decoding of the first and second embodiments, the PHY RS decode fail signal is used to mark erasures for FEC RS decoding. This approach gives fewer erasures as compared to the CRC check because the PHY RS uses smaller granularity (188 bytes) to mark erasures than the CRC check (entire bytes in a datagram, generally approximately 1000 bytes are marked as erasures). Therefore, the total number of erasures in a row given by the PHY RS fail signal should be fewer than the total number of erasures in that row given by the CRC check. Thus, there is more of a chance that the total number of erasures in a row can be smaller than or equal to 64 in the PHY RS case than in the CRC case. Accordingly, all errors are correctable by the FEC RS if the total numbers of erasures in a row is smaller than to equal to 64. Furthermore, fewer erasures help the FEC RS decoding in the erasure mode.

A fourth embodiment is an erasure cache scheme. In MPE-FEC, every byte has to be marked as an erasure or not before FEC RS decoding. This requires a 2 Mbit/8=0.25 Mbit extra storage memory requirement which adds to hardware complexity cost. The fourth embodiment provides an efficient way to implement such an erasure cache in terms of memory size and timing to recover erasures for the all of the bytes. The erasure cache scheme provided by the fourth embodiment is preferably embodied as a standalone synchronous random access memory (SRAM) device 400 having a size of 48960 bits, and preferably organized into 255 columns×16 rows=4080 entries as provided in FIG. 4. Each entry is preferably 12 bits wide. The first entry in a column 403 stores the first datagram tail address of that column 403 in the frame buffer memory 402. This indicates that all bytes in a column before this tail address will have the same erasure flag as the tail byte. In this way, an erasure flag is not stored for each byte, rather only one erasure flag is stored at the end of the datagram. The second entry stores the second datagram tail address in that column 403 if there is one, etc. The 16 entries prepares for the worst case that one column 403 might have 1024/64=16 datagrams. More specifically, the first 10 bit of an entry stores the column address and the 11th bit stores the erasure flag depending on the CRC check of the datagram or the PHY RS decode fail signal of the 188 byte packet output from the PHY RS decoder. Furthermore, the 12th bit is not necessarily used. This describes the structure of the erasure cache scheme. The following describes how this erasure cache scheme is used to provide an erasure flag for each byte stored in the 2 Mb frame buffer memory 402.

During the frame buffer write process, once the CRC is performed, the datagram tail byte address and CRC check bit are stored in the erasure cache 404, one entry per datagram session. There is a 255 bit erasure flag initial register 406 also programmed during the frame buffer write process, with an erasure bit corresponding to the erasure flag for each byte in the first row of each column 403. When the FEC RS decoder 408 begins to decode the frame buffer 402 row-by-row, the row index 410 moves down accordingly and is checked against the row index 410 stored in the entries of each column 403. If there is a hit, the erasure bit from that entry is used to update the erasure flag in the 255 bit erasure flag register 406. This means that when the row index 410 moves down, its index value (column address value) is the same as the column address value stored in the erasure cache entry of that column 403. If there is no hit, then the erasure flag register 406 for that column 403 keeps moving down without change. In this way, each byte in the frame buffer 402 is marked with an erasure=0 or 1 flag when entering the FEC RS for erasure-based decoding. In this way, each datagram byte is rendered with its original erasure flag, without using large memory to store one erasure flag bit for each datagram byte. The FEC RS decoder 408 in the erasure mode uses the erasure flag information for all the 255 bytes belonging to a row.

According to the DVB-H standard, a FEC RS decoder only operates in erasure mode. In response to this limitation, a fifth embodiment provides a dual mode FEC RS decoder 208 (as shown in FIG. 2). If the number of total erasures in a row 206 is not greater than 64, the normal erasure mode is used to correct all the errata bytes. If the number of total erasures is greater than 64, instead of giving up without doing anything, an error mode for this FEC RS is implemented according to the fifth embodiment, which can correct up to 32 bytes in a row 206. This is based on the fact that the erasures in a row 206 are the only possible error bytes which are indicated and marked by the CRC check or PHY RS. It does not mean they are real error bytes. This means that even though the total number of erasures is greater than 64, and the erasure mode of the RS decoder 408 cannot correct anything, the error mode of the RS decoder 408 can correct all the error bytes if the total number of actual error bytes in a row is smaller than or equal to 32. The error mode of the FEC RS decoder 208 is implemented using the well-known Berlekamp-Massey algorithm, which provides an extra error correction capability when the erasure mode fails during FEC RS decoding.

Figure 5A:
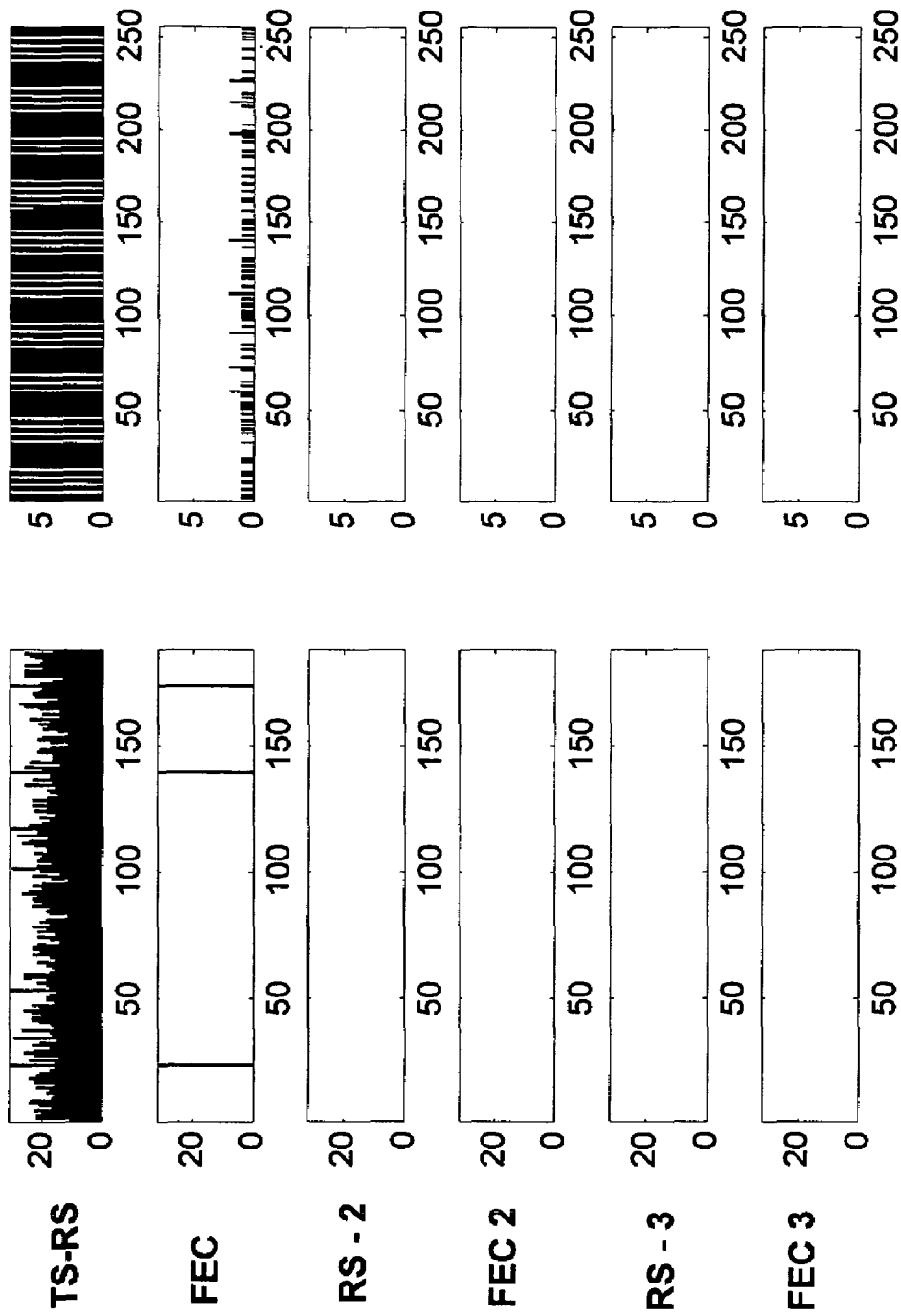
FIGS. 5(a) through 5(c) are graphical representations illustrating a simulated coding gain by using a recursive RS+FEC process according to an embodiment herein.
Figure 5B:
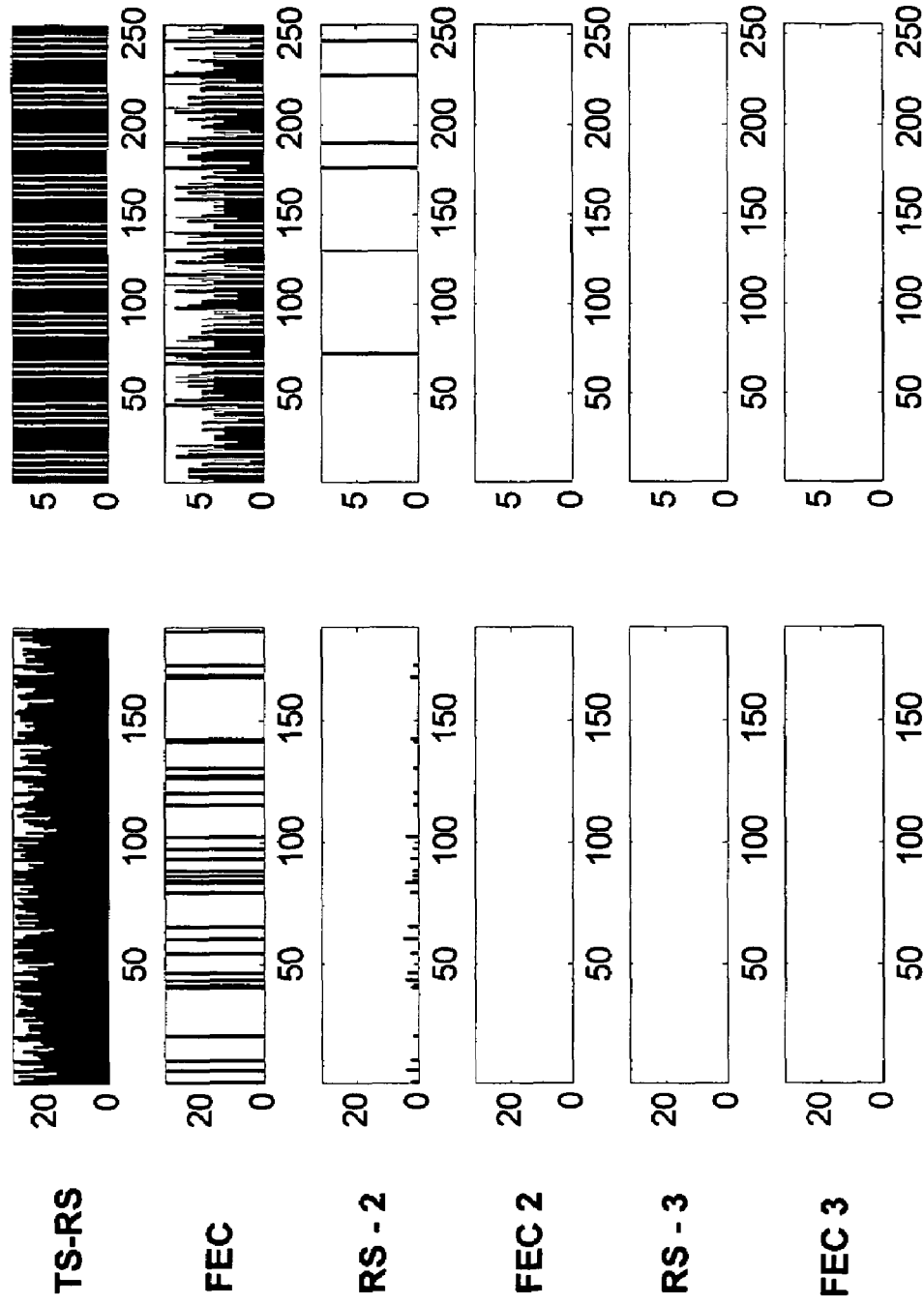
Figure 5C:
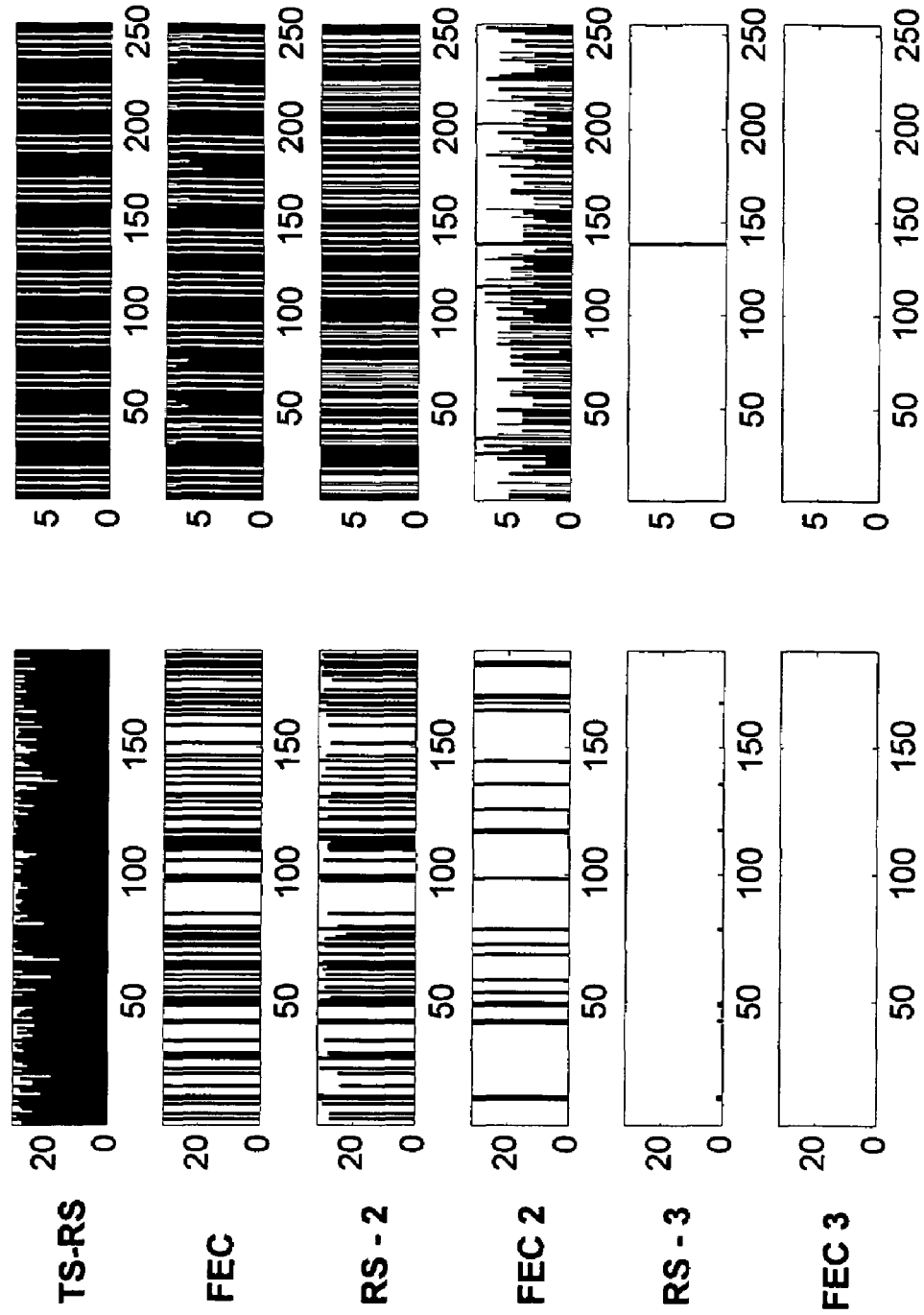

The several embodiments of the invention were experimentally verified using the simulated coding gain by using the recursive RS+FEC approach. In FIGS. 5(a) through 5(c), a signal with three signal-to-noise ratio (SNR) values ranging from 12.7 dB to 11.8 dB are undergoing three iterations of recursive PHY RS+FEC decoding and have all the errata bytes corrected. Compared with the conventional MPE FEC decoding using only one FEC RS decoding step, which is shown in FIG. 5(a), the SNR of 12.7 dB is required. When recursive PHY RS+FEC is used with an iteration number of three, the required SNR can go down to 11.8 dB. The coding gain brought by recursive PHY RS+FEC decoding is thus approximately 1 dB. In FIG. 5(a), the SNR is 12.7 dB. All of the error bytes are corrected in a first pass FEC RS decoding process, as indicated in the FEC row of FIG. 5(a). In FIG. 5(b), the SNR is 12.0 dB, without a PHY RS+FEC RS iteration, the signal has many errors as shown in the FEC row of FIG. 5(b), which means one pass of FEC RS decoding cannot correct the error bytes. With the PHY RS+FEC RS iteration, all of the errors are corrected, as shown in the RS-3 and FEC 3 rows in FIG. 5(b). In FIG. 5(c), the SNR degrades to 11.8 dB, and still all of the errors are not correctable in a first pass FEC RS decoding process, but all are corrected by the PHY RS+FEC RS iterations. These results indicate that with PHY RS+FEC RS iterations, the minimum SNR allowed for all error bytes that are corrected can be relaxed from 12.7 dB to 11.8 dB. Equivalently, the iterative PHY RS+FEC RS decoding gives yields an approximate 1 dB coding gain, thereby demonstrating the efficiencies afforded by the embodiments herein.

Figure 6:
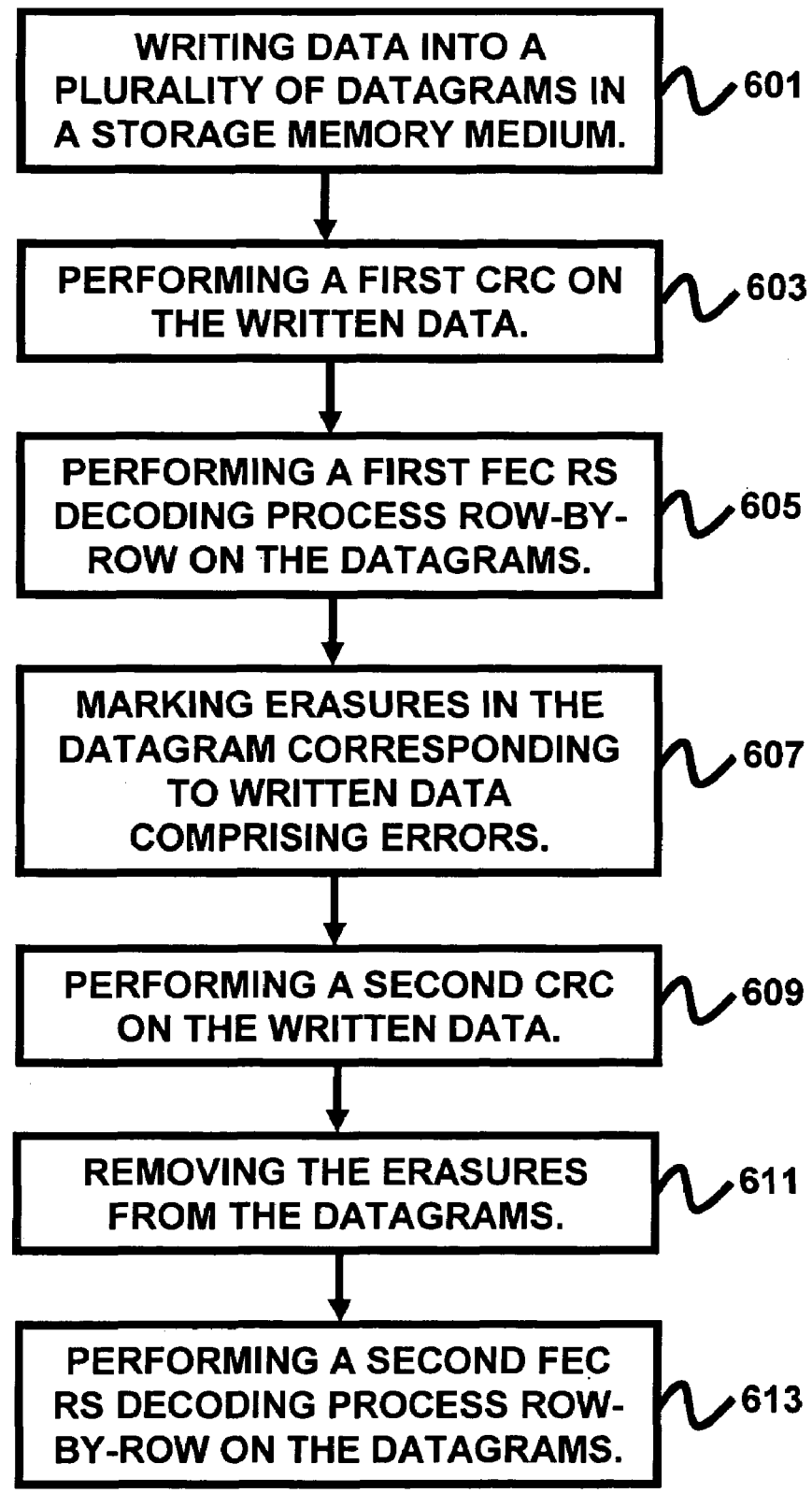
FIG. 6 is flow diagrams illustrating a first method according to the embodiments herein.

FIG. 6, with reference to FIGS. 2 through 5, illustrates a computer-implemented method of performing error detection in data transmission packets, wherein the method comprises writing (601) data into a plurality of datagrams 205 in a storage memory medium 200; performing (603) a first CRC on the written data; performing (605) a first FEC RS decoding process row-by-row on the datagrams 205; marking (607) erasures in the datagram 205 corresponding to written data comprising errors; performing (609) a second CRC on the written data; removing (611) the erasures from the datagrams 205; and performing (613) a second FEC RS decoding process row-by-row 206 on the datagrams 205.

The method may further comprises performing an additional CRC on the written data; removing all the erasures from the datagrams 300; and performing an additional FEC RS decoding process row-by-row 304 on the datagrams 300. In one embodiment, in the removing of the erasures from the datagrams 300, a total number of the erasures in a particular row 304 of the datagram 300 exceeding 64 errata bytes is reduced to less than 64 errata bytes. In another embodiment, a PHY RS decode fail signal is used for the marking of the erasures in the datagram 300. The method may further comprise using an erasure mode of the FEC RS decoding process to correct the errata bytes, wherein the erasure mode is implemented using a Berlekamp-Massey algorithm.

Figure 7:
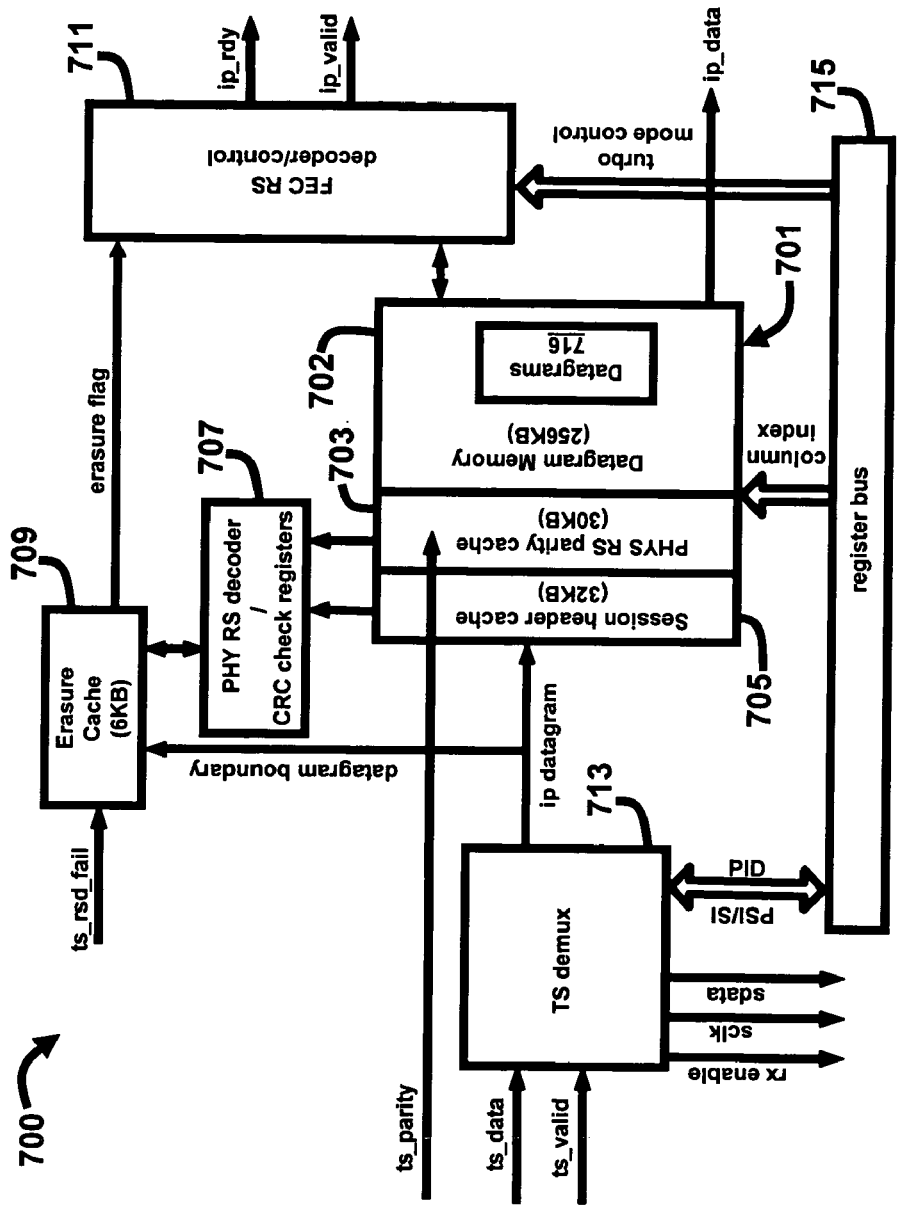
FIG. 7 is a schematic diagram of a system according to an embodiment herein.

FIG. 7 illustrates a diagram of an exemplary system 700 according to an embodiment herein. While FIG. 7 provides preferred numeric sizes for the various devices, these sizes are provided as an example, and the embodiments herein are not limited to any particular device size. Generally, the memory unit 701 preferably comprising a 256 KB datagram memory device 702 comprising datagrams 716, a 30 KB PHYS RS parity cache device 703, and a 32 KB session header cache device 705. A PHYS RS decoder and CRC checking device (registers) 707 communicates with a 6 KB erasure cache device 709 and with the memory unit 701, and in particular with the PHYS RS parity cache 703 and session header cache 705. The erasure cache device 709 is adapted to send erasure flags to a FEC RS decoder 711, which is also operatively connected to the datagram memory device 702. A register bus 715 adapted to send data to the memory unit 711 and the FEC RS decoder 711 is also provided and is further adapted to communicate with a demultiplexer (demux) device 713. Moreover, the demux device 713 is operatively connected to the memory unit 701.

Figure 8:
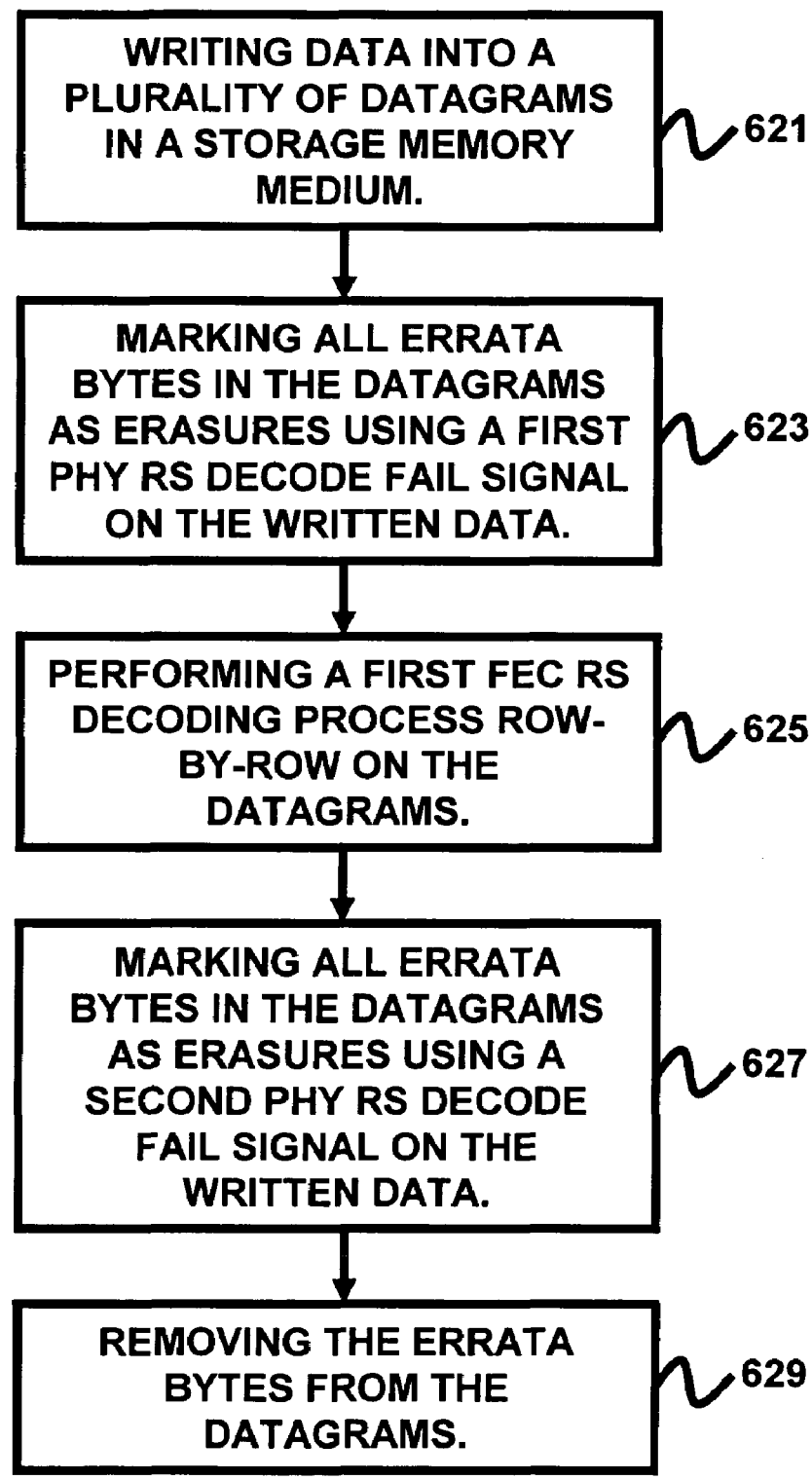
FIG. 8 is flow diagrams illustrating a second method according to the embodiments herein.

FIG. 8, with reference to FIG. 7, illustrates a computer-implemented method of performing error detection in data transmission packets, wherein the method comprises writing (801) data into a plurality of datagrams 716 in a storage memory medium 702; marking (803) all errata bytes in the datagrams 716 as erasures using a first PHY RS decode fail signal on the written data; performing (805) a first FEC RS decoding process row-by-row on the datagrams 716; marking (807) all errata bytes in the datagrams 716 as erasures using a second PHY RS decode fail signal on the written data; and removing (809) the errata bytes from the datagrams 716.

In another embodiment, the method may further comprise marking all errata bytes in the datagrams 716 as erasures using a third PHY RS decode fail signal on the written data. Additionally, the method may further comprise using an erasure mode of the FEC RS decoding process to correct the errata bytes, wherein the erasure mode is implemented using a Berlekamp-Massey algorithm.

The embodiments herein can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

A representative hardware environment for practicing the embodiments of the invention is depicted in FIG. 9. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a RAM 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Generally, the embodiments herein provide a system and method of using recursive CRC+FEC for enhancing the channel coding gain for a DVB-H receiver, and using a PHY RS decoder+FEC to achieve better coding gain. The system and method utilize a dual mode RS decoder (erasure mode and error mode) for FEC decoding. The PHY RS is used to provide smaller granularity for FEC. The system includes a cache memory management scheme for implementing the recursive CRC/RS+FEC in very large scale integrated circuit chip (VLSI) hardware.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A method of performing error detection in data transmission packets, said method comprising:
    writing data into a plurality of datagrams in a storage memory medium;
    performing a first cyclic redundancy check (CRC) on the written data;
    performing a first forward error correction (FEC) Reed-Solomon (RS) decoding process row-by-row on said datagrams using a dual mode decoder operable in both an erasure mode and an error mode;
    marking erasures in said datagram corresponding to written data comprising errors;
    performing a second CRC on said written data;
    removing said erasures from said datagrams; and
    performing a second FEC RS decoding process row-by-row on said datagrams using said dual mode decoder,
    wherein in the removing of said erasures from said datagrams, a total number of said erasures in a particular row of said datagram exceeding 64 errata bytes is reduced to less than 64 errata bytes, and
    wherein a physical (PHY) RS decode fail signal is used for the marking of said erasures in said datagram.

2. The method of claim 1, further comprising:
    performing an additional CRC on said written data;
    removing all said erasures from said datagrams; and
    performing an additional FEC RS decoding process row-by-row on said datagrams.

3. The method of claim 1, further comprising using an erasure mode of said FEC RS decoding process to correct said errata bytes, wherein said erasure mode is implemented using a Berlekamp-Massey algorithm.

4. The method of claim 1, wherein said error detection is performed in a Digital Video Broadcasting—Handheld (DVB-H) receiver.

5. The device of claim 1, wherein said storage memory medium comprises a synchronous random access memory (SRAM) device.

6. A method of performing error detection in data transmission packets, said method comprising:
- writing data into a plurality of datagrams in a storage memory medium;
- marking all errata bytes in said datagrams as erasures using a first physical (PHY) RS decode fail signal on the written data;
- performing a first forward error correction (FEC) Reed-Solomon (RS) decoding process row-by-row on said datagrams using a dual mode decoder operable in both an erasure mode and an error mode;
- marking all errata bytes in said datagrams as erasures using a second PHY RS decode fail signal on the written data;
- removing said errata bytes from said datagrams, wherein a total number of said erasures in a particular row of said datagram exceeding 64 errata bytes is reduced to less than 64 errata bytes;
- marking all errata bytes in said datagrams as erasures using a third physical (PHY) RS decode fail signal on the written data; and
- using an erasure mode of said FEC RS decoding process to correct said errata bytes, wherein said erasure mode is implemented using a Berlekamp-Massey algorithm.

7. The method of claim 6, wherein said error detection is performed in a Digital Video Broadcasting—Handheld (DVB-H) receiver.

8. The device of claim 6, wherein said storage memory medium comprises a synchronous random access memory (SRAM) device.

9. A device capable for detecting errors in a data transmission packet, said device comprising:
- a storage memory medium;
- a buffer operable for writing data into a plurality of datagrams in said storage memory medium;
- a first register operable performing a first cyclic redundancy check (CRC) on the written data;
- a decoder operable for performing a first forward error correction (FEC) Reed-Solomon (RS) decoding process row-by-row on said datagrams;
- errata bytes corresponding to erasures in said datagram corresponding to written data comprising errors; and
- a second register operable for performing a second CRC on said written data; and
- a third register operable for removing said erasures from said datagrams,
- wherein said decoder is operable for performing a second FEC RS decoding process row-by-row on said datagrams,
- "wherein a total number of said erasures in a particular row of said datagram exceeding 64 errata bytes is reduced to less than 64 errata bytes in said second register, and wherein a physical (PHY) RS decode fail signal is used for marking of said erasures in said datagram."

10. The device of claim 9, further comprising:
- a fourth register operable for performing an additional CRC on said written data and removing all said erasures from said datagrams,
- wherein said decoder is operable for performing an additional FEC RS decoding process row-by-row on said datagrams.

11. The device of claim 9, wherein said FEC RS decoding process comprises an erasure mode operable to correct said errata bytes, wherein said erasure mode is implemented using a Berlekamp-Massey algorithm.

12. The device of claim 9, wherein said error detection is performed in a Digital Video Broadcasting—Handheld (DVB-H) receiver.

13. The device of claim 9, wherein said decoder comprises a dual mode decoder operable in both an erasure mode and an error mode.

14. The device of claim 9, wherein said storage memory medium comprises a synchronous random access memory (SRAM) device.

15. A device capable for detecting errors in a data transmission packet, said device comprising:
- a storage memory medium;
- a buffer operable for writing data into a plurality of datagrams in said storage memory medium;
- a first physical (PHY) RS decode fail signal device operable for marking all errata bytes in said datagrams as erasures on the written data;
- a decoder operable for performing a first forward error correction (FEC) Reed-Solomon (RS) decoding process row-by-row on said datagrams, wherein said decoder is operable in both an erasure mode and an error mode, and wherein the error mode of said FEC RS decoding process is operable to correct said errata bytes, wherein said error mode is implemented using a Berlekamp-Massey algorithm;
- a second PHY RS decode fail signal device operable for marking all errata bytes in said datagrams as erasures on the written data;
- a third physical (PHY) RS decode fail signal device operable for marking all errata bytes in said datagrams as erasures on the written data; and
- a register operable for removing said errata bytes from said datagrams,
- wherein a total number of said erasures in a particular row of said datagram exceeding 64 errata bytes is reduced to less than 64 errata bytes in said register.

16. The device of claim 15, wherein said error detection is performed in a Digital Video Broadcasting—Handheld (DVB-H) receiver.

17. The device of claim 15, wherein said storage memory medium comprises a synchronous random access memory (SRAM) device.

18. An error-detection device comprising:
- a frame buffer memory device comprising datagrams organized into rows and columns comprising entries into which data may be entered;
- an erasure cache register operatively connected to said frame buffer memory device;
- an erasure flag register operatively connected to said erasure cache register, wherein said erasure flag register comprises an erasure bit for each byte in a first row of each column; and
- a decoder operable for performing multiple forward error correction (FEC) Reed-Solomon (RS) decoding processes on said datagrams in said frame buffer memory device,
- wherein each byte in said frame buffer memory device is marked with an erasure flag equaling any of 0 and 1 when entering said decoder,
- wherein said erasure cache register comprises a datagram tail byte address and a cyclic redundancy check (CRC) check bit, and
- wherein said decoder is operable for decoding said datagrams row-by-row, wherein a row index moves down accordingly and is checked against the row index stored in the entries of each column.

19. The device of claim 18, wherein said error detection is performed in a Digital Video Broadcasting—Handheld (DVB-H) receiver.

20. The device of claim 18, wherein said decoder comprises a dual mode decoder operable in both an erasure mode and an error mode.

21. A program storage device readable by computer, tangibly embodying a program of instructions executable by said computer to perform a method of performing error detection in data transmission packets, said method comprising:
- writing data into a plurality of datagrams in a storage memory medium;
- performing a first cyclic redundancy check (CRC) on the written data;
- performing a first forward error correction (FEC) Reed-Solomon (RS) decoding process row-by-row on said datagrams using a dual mode decoder operable in both an erasure mode and an error mode;
- marking erasures in said datagram corresponding to written data comprising errors;
- performing a second CRC on said written data;
- removing said erasures from said datagrams, wherein a total number of said erasures in a particular row of said datagram exceeding 64 errata bytes is reduced to less than 64 errata bytes; and
- performing a second FEC RS decoding process row-by-row on said datagrams using said dual mode decoder,
- wherein a physical (PHY) RS decode fail signal is used for the marking of said erasures in said datagram.

22. The program storage device of claim 21, wherein said method further comprises:
- performing an additional CRC on said written data;
- removing all said erasures from said datagrams; and
- performing an additional FEC RS decoding process row-by-row on said datagrams.

23. The program storage device of claim 21, wherein said method further comprises using an erasure mode of said FEC RS decoding process to correct said errata bytes, wherein said erasure mode is implemented using a Berlekamp-Massey algorithm.

24. The program storage device of claim 21, wherein said error detection is performed in a Digital Video Broadcasting—Handheld (DVB-H) receiver.

25. The device of claim 21, wherein said storage memory medium comprises a synchronous random access memory (SRAM) device.

26. A program storage device readable by computer, tangibly embodying a program of instructions executable by said computer to perform a method of performing error detection in data transmission packets, said method comprising:
- writing data into a plurality of datagrams in a storage memory medium;
- marking all errata bytes in said datagrams as erasures using a first physical (PHY) RS decode fail signal on the written data;
- performing a first forward error correction (FEC) Reed-Solomon (RS) decoding process row-by-row on said datagrams using a dual mode decoder operable in both an erasure mode and an error mode;
- marking all errata bytes in said datagrams as erasures using a second PHY RS decode fail signal on the written data; and
- removing said errata bytes from said datagrams.

27. The program storage device of claim 26, wherein in the removing of said errata bytes from said datagrams, a total number of said erasures in a particular row of said datagram exceeding 64 errata bytes is reduced to less than 64 errata bytes.

28. The program storage device of claim 27, wherein said method further comprises using an error mode of said FEC RS decoding process to correct said errata bytes, wherein said error mode is implemented using a Berlekamp-Massey algorithm.

29. The program storage device of claim 26, wherein said method further comprises marking all errata bytes in said datagrams as erasures using a third physical (PHY) RS decode fail signal on the written data.

30. The program storage device of claim 26, wherein said error detection is performed in a Digital Video Broadcasting—Handheld (DVB-H) receiver.

* * * * *

UNITED STATES PATENT AND TRADEMARK OFFICE
CERTIFICATE OF CORRECTION

PATENT NO. : 7,447,980 B2  Page 1 of 1
APPLICATION NO. : 11/251721
DATED : November 4, 2008
INVENTOR(S) : Xu et al.

It is certified that error appears in the above-identified patent and that said Letters Patent is hereby corrected as shown below:

Please delete Column 6, line 2, and in its place insert:
--bytes, the extra 32KB memory 307 and 16KB memory 305--

Please delete Column 6, line 13, and in its place insert:
--from the 32KB and 16KB memories 307, 305 respectively of--

Please delete Column 6, line 17, and in its place insert:
--32KB and 16KB memories 307, 305 together with the--

Please delete Column 8, line 51, and in its place insert:
--715 adapted to send data to the memory unit 701 and the FEC--

Signed and Sealed this

Twelfth Day of January, 2010

David J. Kappos
*Director of the United States Patent and Trademark Office*